United States Patent
Tsai et al.

(10) Patent No.: US 9,331,066 B2
(45) Date of Patent: May 3, 2016

(54) METHOD AND COMPUTER-READABLE MEDIUM FOR DETECTING PARASITIC TRANSISTORS BY UTILIZING EQUIVALENT CIRCUIT AND THRESHOLD DISTANCE

(71) Applicant: TAIWAN SEMICONDUCTOR MANUFACTURING COMPANY LTD., Hsinchu (TW)

(72) Inventors: Ming-Huei Tsai, Miaoli County (TW); Yao-Jen Hsieh, Taipei (TW); Kai-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 190 days.

(21) Appl. No.: 14/163,342

(22) Filed: Jan. 24, 2014

(65) Prior Publication Data

US 2015/0212134 A1  Jul. 30, 2015

(51) Int. Cl.
  *G06F 17/50* (2006.01)
  *H01L 27/02* (2006.01)

(52) U.S. Cl.
  CPC ........ *H01L 27/0259* (2013.01); *G06F 17/5036* (2013.01); *G06F 17/5081* (2013.01); *G06F 17/5068* (2013.01)

(58) Field of Classification Search
  CPC .................. G06F 17/5081; G06F 17/5068
  USPC .................................... 716/122, 136
  See application file for complete search history.

(56) References Cited

U.S. PATENT DOCUMENTS

| | | | | |
|---|---|---|---|---|
| 4,692,781 A * | 9/1987 | Rountree | ............ | H01L 27/0251 257/360 |
| 7,586,721 B2 | 9/2009 | Wang et al. | | |
| 7,838,924 B2 * | 11/2010 | Boselli | ................ | H01L 27/0259 257/328 |
| 7,884,617 B2 | 2/2011 | Ker et al. | | |
| 8,307,312 B2 * | 11/2012 | Terabe | ................ | G06F 17/5031 716/105 |
| 2005/0247979 A1 * | 11/2005 | Fung | .................... | H01L 27/0259 257/355 |
| 2006/0001100 A1 * | 1/2006 | Kamei | ................ | G06F 17/5036 257/355 |
| 2006/0048080 A1 * | 3/2006 | Watson | ............... | G06F 17/5081 716/115 |
| 2006/0225012 A1 * | 10/2006 | Deura | ................. | G06F 17/5081 716/112 |
| 2007/0045743 A1 * | 3/2007 | Tseng | ................. | H01L 27/0259 257/355 |
| 2007/0181948 A1 * | 8/2007 | Liaw | .................... | H01L 29/8611 257/355 |
| 2007/0209026 A1 * | 9/2007 | Kemerer | ............. | G06F 17/5081 716/112 |
| 2011/0205673 A1 * | 8/2011 | Okushima | ............ | H03K 19/003 361/56 |
| 2013/0019222 A1 * | 1/2013 | Domanski | ........... | G06F 17/5081 716/136 |

* cited by examiner

*Primary Examiner* — Stacy Whitmore

(74) *Attorney, Agent, or Firm* — WPAT, P.C., Intellectual Property Attorneys; Anthony King

(57) ABSTRACT

A method of detecting a parasitic transistor detecting is provided. The method includes extracting several diodes from a selected area, selecting at least one diode pair from the diodes in accordance with signals connected to the diodes, and filtering the at least one diode pair in accordance with a threshold distance to determine whether at least one parasitic transistor is obtained.

15 Claims, 10 Drawing Sheets

METHOD AND COMPUTER-READABLE MEDIUM FOR DETECTING PARASITIC TRANSISTORS BY UTILIZING EQUIVALENT CIRCUIT AND THRESHOLD DISTANCE

TECHNICAL FIELD

The present disclosure is related to a method of detecting a parasitic transistor.

BACKGROUND

Electrostatic discharge (ESD) is the sudden flow of electricity between two electrically charged objects caused by contact, an electrical short, or dielectric breakdown. ESD occurs when differently-charged objects are brought close together or when the dielectric between them breaks down. ESD can cause a range of harmful effects of importance in industry, including gas, fuel vapour and coal dust explosions, as well as failure of solid state electronics components such as integrated circuits (ICs). These can suffer permanent damage when subjected to high voltages. Manufacturers of integrated circuits usually take precautions to avoid ESD. ESD prevention can be part of the device itself and include special design techniques for device input and output pins. External protection components can also be used with circuit layout. In an IC chip, there are some high voltage electrostatic discharge (HVESD) protection circuits or low voltage electrostatic discharge (LVESD) protection circuits to prevent ESD damage. However, if some parasitic transistors exist in the IC chip, they may cause potential ESD risk in the high voltage design.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
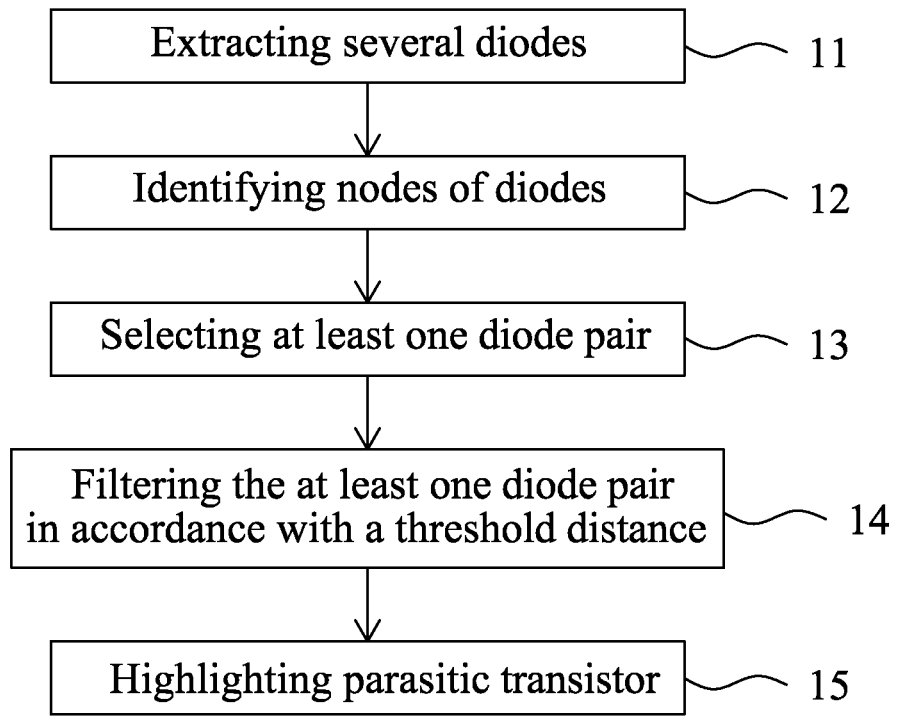
FIG. 1 is a flow diagram of a method of detecting a parasitic transistor in accordance with some embodiments.

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral. It will be understood that when an element is referred to as being "connected to" or "coupled to" another element, it may be directly connected to or coupled to the other element, or intervening elements may be present.

FIG. 1 is a flow diagram of a method of detecting a parasitic transistor in accordance with some embodiments. In an embodiment, a systematic utility or a commercial tool is used to carry out one or more operations in the design flow.

Figure 2:
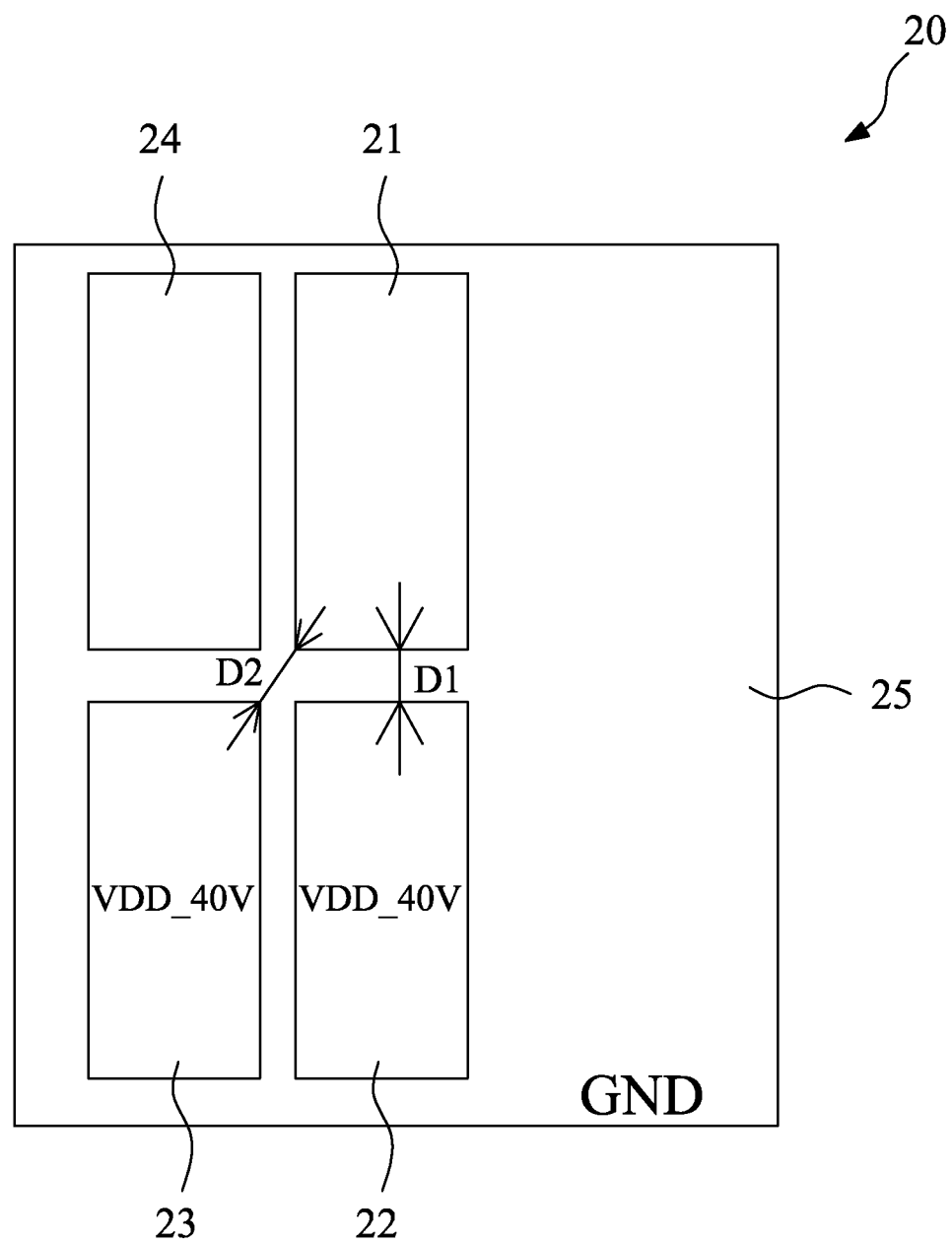
FIG. 2 is a schematic layout view of a selected area in accordance with some embodiments.

In operation 11, several diodes are extracted from a selected area. In an embodiment, the diodes are extracted according to a layout view of the selected area. FIG. 2 is a schematic layout view of a selected area 20 in accordance with some embodiments. In an embodiment, the layout of the selected area 20 shows a first N well 21, a second N well 22, a third N well 23, a fourth N well 24 and a P substrate 25. The first N well 21, the second N well 22, the third N well 23 and the fourth N well 24 are high voltage N well (HVNW). Moreover, the first N well 21, the second N well 22, the third N well 23 and the fourth N well 24 are surrounded by the P substrate 25. Further, the first N well 21 and the P substrate 25 define a first equivalent diode. The second N well 22 and the P substrate 25 define a second equivalent diode. The third N well 23 and the P substrate 25 define a third equivalent diode. The fourth N well 24 and the P substrate 25 define a fourth equivalent diode.

Figure 3:
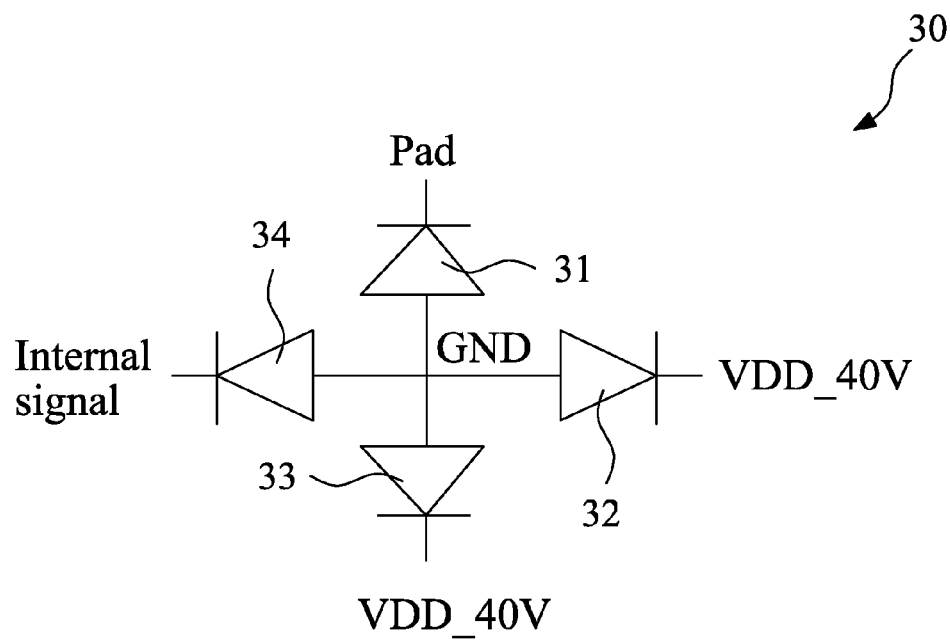
FIG. 3 is a schematic diagram of an equivalent circuit for the layout view of the selected area in FIG. 2 in accordance with some embodiments.

FIG. 3 is a schematic diagram of an equivalent circuit 30 for the layout of the selected area 20 in accordance with some embodiments. Referring to FIG. 2 and FIG. 3, the layout of the selected area 20 is converted to the equivalent circuit 30, and the equivalent circuit 30 for the layout of the selected area 20 includes a first diode 31, a second diode 32, a third diode 33 and a fourth diode 34. The first diode 31 is defined by the first N well 21 and the P substrate 25. The second diode 32 is defined by the second N well 22 and the P substrate 25. The third diode 33 is defined by the third N well 23 and the P substrate 25. The fourth diode 34 is defined by the fourth N well 24 and the P substrate 25. For the first diode 31, the second diode 32, the third diode 33 and the fourth diode 34, the P substrate 25 is a common terminal. A positive terminal of the first diode 31, a positive terminal of the second diode 32, a positive terminal of the third diode 33 and a positive terminal of the fourth diode 34 are connected together to the common terminal, the P substrate 25.

Referring back to FIG. 1, in operation 12, nodes of the diodes in the selected area 20 are identified. Referring again to FIG. 2, in an embodiment, power/ground (PWR/GND) text is shown on the nodes of the layout view of the selected area 20. For example, VDD_40V is shown on the node of the second N well 22, which means that the second N well 22 is connected to a voltage source VDD and the voltage source VDD is 40V. Similarly, VDD_40V is shown on the node of the third N well 23, which means that the third N well 23 is also connected to the voltage source VDD of 40V. GND is shown on the node of the P substrate 25, and thus the P substrate 25 is connected to a ground GND. The voltage source VDD and the ground GND belong to input/output (I/O) signals. Therefore, by identifying nodes of the layout, nodes of the diodes can be identified to determine the signals connected to the diodes. That is, signals connected to the diodes are traced by identifying nodes of the layout.

Some nodes of the layout do not have any text. For example, the first N well 21 does not have any text, and the fourth N well 24 does not have any text, either. Since no text on the nodes of the first N well 21 and the fourth N well 24, a tracing step is used to determine if the first N well 21 and the fourth N well 24 are connected to an external signal or an internal signal. In an embodiment, the first N well 21 is connected to an internal signal, and the fourth N well 24 is connected to an external signal. For example, the fourth N well 24 is traced and is found to be connected to a pad for receiving an external signal. Accordingly, the fourth N well 24 can be determined as one that connects to an I/O signal including the external signal. In some embodiments, an internal signal does not belong to an I/O signal.

Referring again to FIG. 3, given the above, the common terminal of the first diode 31, the second diode 32, the third diode 33 and the fourth diode 34 are connected to the ground GND. A negative terminal of the first diode 31 is connected to the pad, which is one of the I/O terminals for receiving an external signal. A negative terminal of the second diode 32 is connected to the voltage source VDD of 40V. A negative terminal of the third diode 33 is also connected to the voltage source VDD. A negative terminal of the fourth diode 34 is connected to an internal signal, which is not an I/O signal.

Referring back to FIG. 1, in operation 13, at least one diode pair is selected from the diodes in accordance with signals connected to the diodes. Each diode pair includes two diodes connected to one another, and has a common terminal and two I/O terminals. The two I/O terminals are connected to different I/O signals. That is, the requirements for a diode pair lie in that the diode pair has one common terminal and two I/O terminals connected to different I/O signals. The I/O signals include voltage source, ground and external signal.

Figure 4:
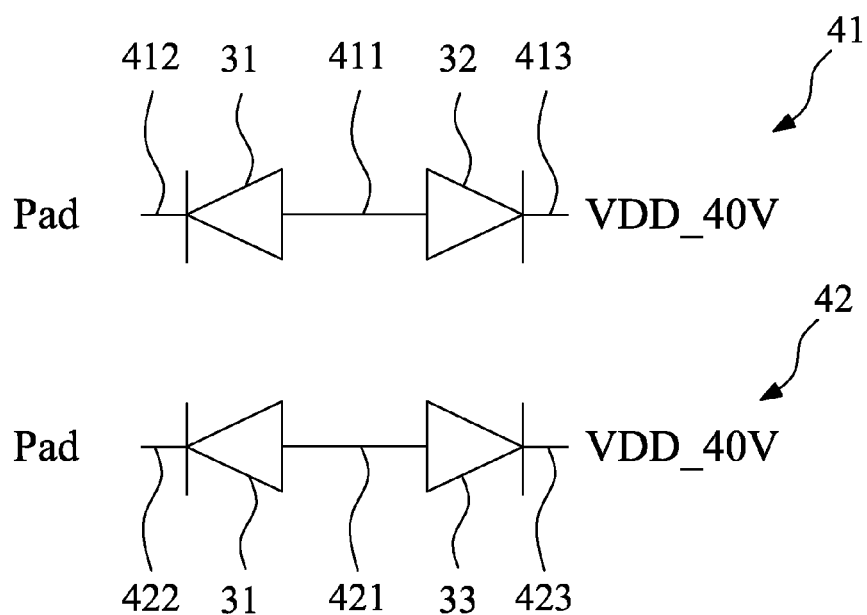
FIG. 4 is a diagram of two selected diode pairs for the layout view of the selected area in FIG. 2 in accordance with some embodiments.

FIG. 4 is a diagram of two selected diode pairs 41, 42 for the layout view of the selected area 20 in accordance with some embodiments. Referring to FIG. 3 and FIG. 4, according to the above requirements, two diode pairs 41 and 42 are selected from the equivalent circuit 30. A first diode pair 41 includes the first diode 31 and the second diode 32. The positive terminal of the first diode 31 is connected to the positive terminal of the second diode 32 at a common terminal 411 of the first diode pair 41. The negative terminal of the first diode 31 is an I/O terminal 412 of the first diode pair 41, and the negative terminal of the second diode 32 is another I/O terminal 413 of the first diode pair 41. As stated previously, the negative terminal of the first diode 31 is connected to the pad for receiving an external signal, and the negative terminal of the second diode 32 is connected to the voltage source VDD. The external signal and the voltage source are different I/O signals. Thus, the two I/O terminals 412, 413 of the first diode pair 41 are connected to different I/O signals. The first diode pair 41 thus meets the requirements. The first diode pair 41 is determined to be an NPN transistor.

A second diode pair 42 includes the first diode 31 and the third diode 33. The positive terminal of the first diode 31 is connected to the positive terminal of the third diode 33 at a common terminal 421 of the second diode pair 42. The negative terminal of the first diode 31 is an I/O terminal 422 of the second diode pair 42, and the negative terminal of the third diode 33 is another I/O terminal 423 of the second diode pair 42. As stated previously, the negative terminal of the first diode 31 is connected to the pad for receiving an external signal, and the negative terminal of the third diode 33 is connected to the voltage source VDD. The external signal and the voltage source are different I/O signals. Thus, the two I/O terminals 422, 423 of the second diode pair 42 are connected to different I/O signals. The second diode pair 42 meets the requirements. The second diode pair 42 is determined to be an NPN transistor.

Referring back to FIG. 1, in operation 14, the at least one diode pair is filtered in accordance with a threshold distance to determine whether at least one parasitic transistor exists. Referring to FIG. 4, since the first diode pair 41 and the second diode pair 42 meet the requirements, the first diode pair 41 and the second diode pair 42 are selected as candidate parasitic transistors. A candidate parasitic transistor may cause a potential ESD risk. One of the factors to cause ESD in the candidate parasitic transistor is a minimum distance between two I/O terminals of the candidate parasitic transistor. If the minimum distance is smaller than the threshold distance, the probability of causing ESD in the candidate parasitic transistor increases. Effectively, by comparing the minimum distance in a diode pair with the threshold distance, a parasitic transistor can be determined and obtained.

Referring to FIGS. 2 and 4, the first N well 21, the P substrate 25 and the second N well 22 define the first diode pair 41, and the first N well 21, the P substrate 25 and the third N well 23 define the second diode pair 42. The minimum distance between the two I/O terminals of the first diode pair 41 is a first minimum distance D1 between the first N well 21 and the second N well 22. The minimum distance between the two I/O terminals of the second diode pair 42 is a second minimum distance D2 between the first N well 21 and the third N well 23. In this embodiment, the first minimum distance D1 is approximately 8 micrometers (µm), and the second minimum distance D2 is approximately 11 µm. The threshold distance, for example, is approximately 9 µm. In an embodiment, the threshold distance is determined by a specific high voltage indicated on a dummy layer. That is, the threshold distance can be adjusted according to the high voltage applied to a selected area. Because the first minimum distance D1 is smaller than the threshold distance, the first diode pair 41 is determined to be a parasitic transistor. Further, because the second minimum distance D2 is greater than the threshold distance, the second diode pair 42 is not a parasitic transistor.

Referring back to FIG. 1, in operation 15, the parasitic transistor determined in operation 14 is highlighted. Referring to FIG. 2 and FIG. 4, according to the above embodiments, the first diode pair 41 is a parasitic transistor, and may cause a potential ESD risk. Since a designer designs a circuit according to the layout, and the first N well 21, the P substrate 25 and the second N well 22 define the first diode pair 41, these elements that may incur a potential ESD risk should be highlighted on the layout to warn the designer. In an embodiment, the color of the first N well 21 and the second N well 22 is changed to a specific warning color on the layout.

Therefore, the method of the disclosure in some embodiments can automatically detect a parasitic transistor which may cause a potential ESD risk by a programmed computing device and thus can reduce detection time. In some existing approaches, to identify a parasitic transistor in a layout, NPN or PNP transistors that could be formed in a circuit design of the layout are checked by, for example, human inspection. Taking the selected area 20 as illustrated in FIG. 2 for example, a total number of six NPN transistors (including two lateral, two vertical and two diagonal transistors) is required for inspection in the existing approaches. By comparison, by identifying and filtering diode pairs in accordance with the inventive method, only two diode pairs are inspected. Accordingly, the method of the disclosure can improve accuracy of detecting a potential ESD risk caused by a parasitic transistor, and provide a more convenient interface to trace ESD violation in a layout.

In the above embodiment, diodes are extracted from the selected area 20, then at least one diode pair is selected and filtered to determine whether a parasitic transistor exists. The method of the disclosure, based on the diode pair identification and filtering, is applicable to capturing an HV parasitic transistor, for example, NPN, which may cause a potential ESD risk in an HV circuit design.

Figure 5:
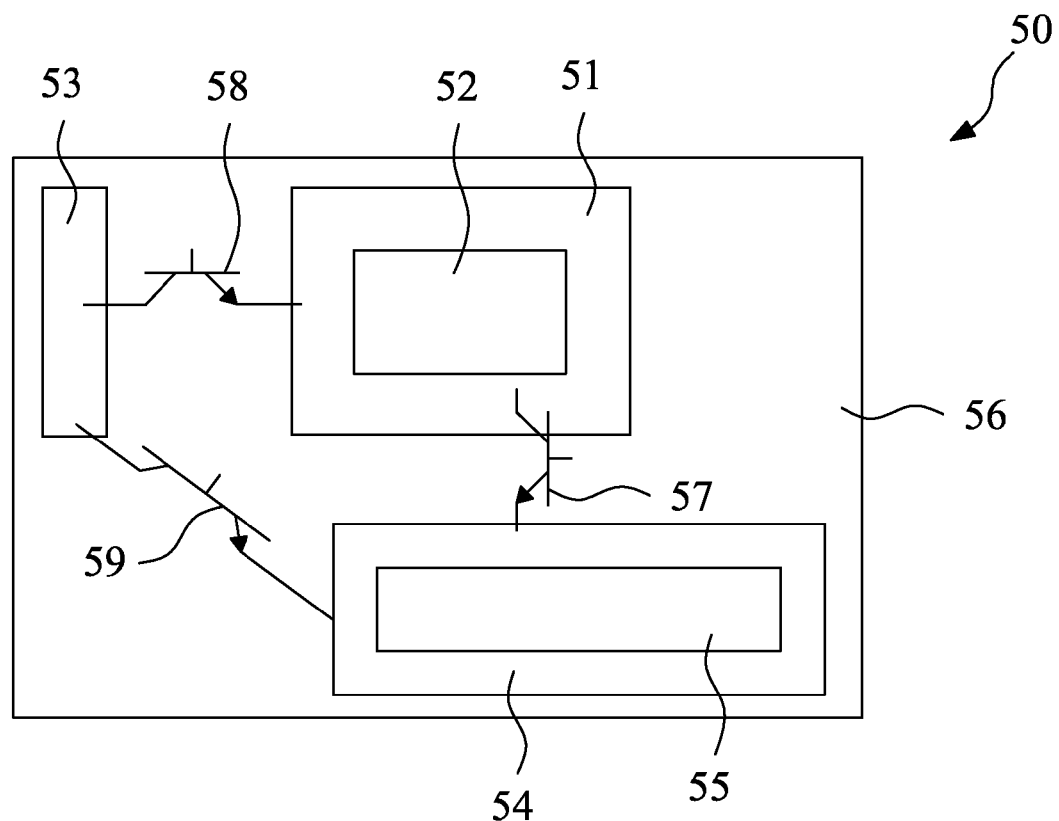
FIG. 5 is a schematic layout view of several equivalent transistors in a selected area in accordance with some embodiments.

FIG. 5 is a schematic layout view of several equivalent transistors in a selected area 50 in accordance with some embodiments. In an embodiment, the layout shows a fifth N well 51, a first P substrate 52, a sixth N well 53, a seventh N well 54, a second P substrate 55 and a third P substrate 56. The first P substrate 52 is disposed inside the fifth N well 51, which in turn is surrounded by the third P substrate 56. The sixth N well 53 is also surrounded by the third P substrate 56. The second P substrate 55 is disposed inside the seventh N well 54, which in turn is surrounded by the third P substrate 56.

The fifth N well 51, the third P substrate 56 and the seventh N well 54 define a parasitic transistor 57, for example, an NPN parasitic transistor. The fifth N well 51, the third P substrate 56 and the sixth N well 53 define a parasitic transistor 58. The sixth N well 53, the third P substrate 56 and the seventh N well 54 define a parasitic transistor 59. Since there are many combinations that can define a parasitic transistor, it is difficult to directly extract the parasitic transistor in the whole design by tool or human inspection.

Figure 6A:
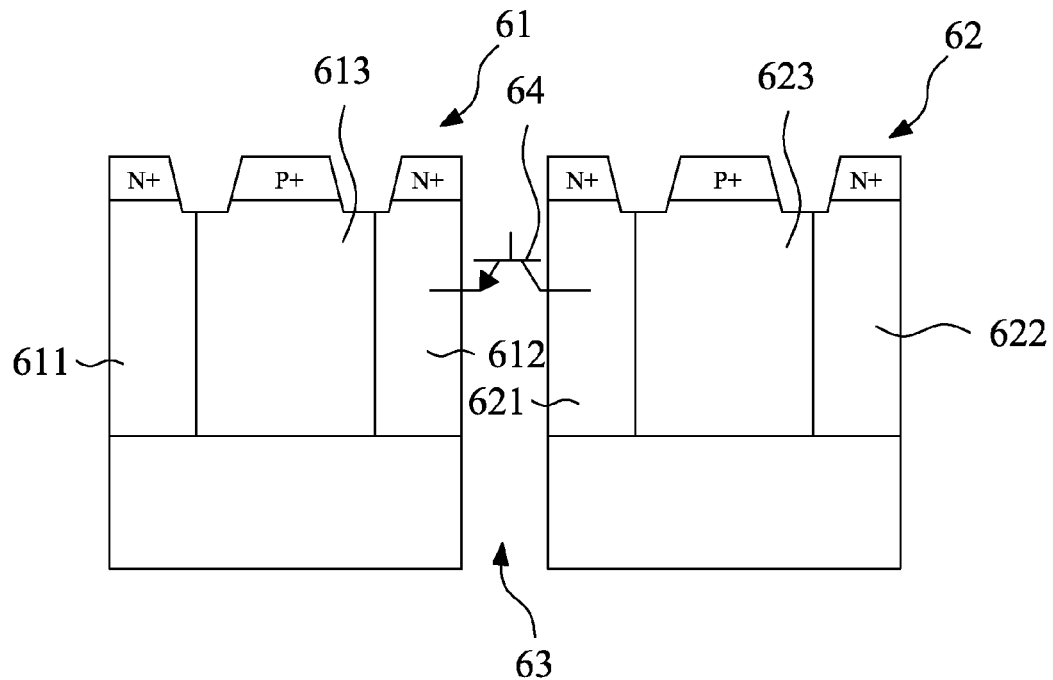
FIG. 6A is a schematic view showing a parasitic transistor between two transistors in accordance with some embodiments.

FIG. 6A is a schematic view showing a parasitic transistor between two transistors in accordance with some embodiments. In an embodiment, a first NPN transistor 61 includes a first high voltage N well 611, a second high voltage N well 612 and a first P substrate 613. A second NPN transistor 62 includes a third high voltage N well 621, a fourth high voltage N well 622 and a second P substrate 623. The first NPN transistor 61 and the second NPN transistor 62 are surrounded by a third P substrate 63. A parasitic transistor 64 is defined between the first NPN transistor 61 and the second NPN transistor 62. That is, the second high voltage N well 612, the third P substrate 63 and the third high voltage N well 621 define the parasitic transistor 64.

Figure 6B:
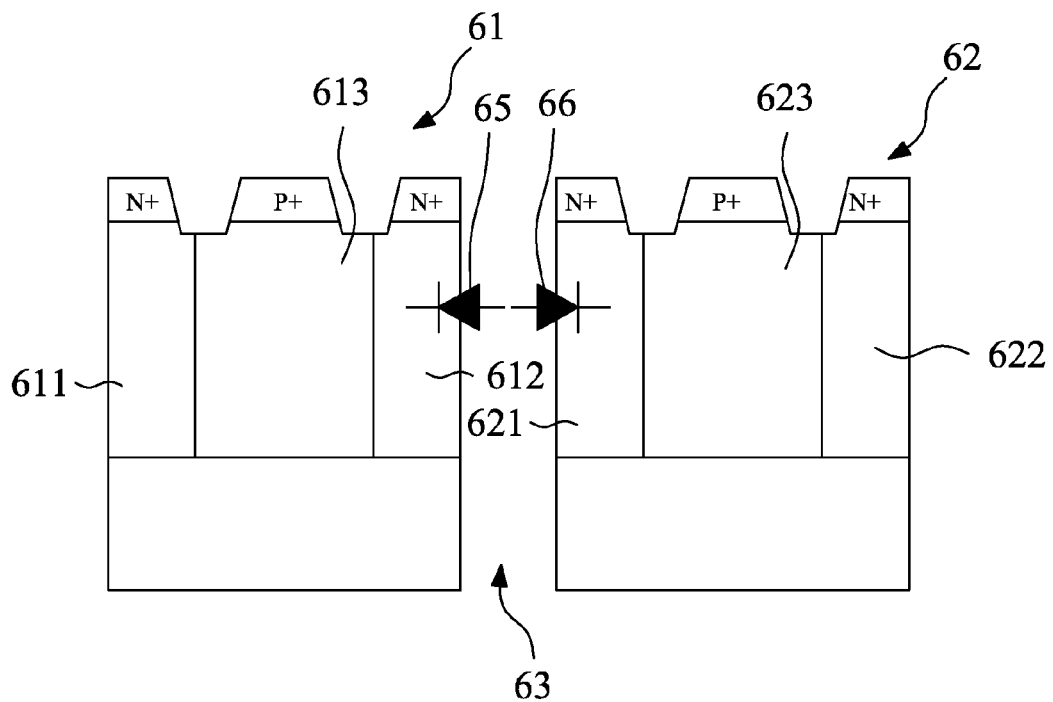
FIG. 6B is a schematic view showing two equivalent diodes between two transistors in accordance with some embodiments.

However, as stated previously, it is difficult to directly extract parasitic transistors in the whole design by tool or human inspection. According to a method of the present disclosure, the parasitic transistor 64 is divided into two diodes. FIG. 6B is a schematic view showing two equivalent diodes between two transistors in accordance with some embodiments. Referring to FIG. 6A and FIG. 6B, the parasitic transistor 64 is divided into two diodes 65 and 66. In FIG. 6B, the second high voltage N well 612 and the third P substrate 63 define the diode 65, and the third P substrate 63 and the third high voltage N well 621 define the diode 66. By dividing one transistor into two diodes, the diodes can be extracted in accordance with the above method of the disclosure. Then a parasitic transistor which may cause a potential ESD risk can be determined by, for example, a programmed computing device, to overcome the problem that the parasitic transistor cannot be extracted directly in the whole design.

Figure 7A:
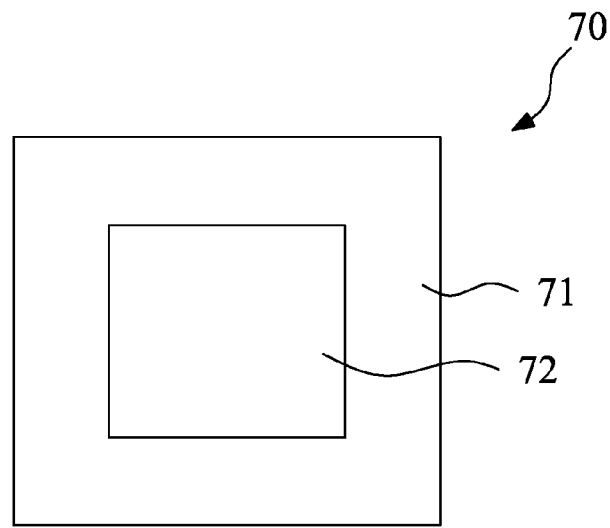
FIG. 7A is a schematic layout view of a selected area in accordance with some embodiments.
Figure 7B:
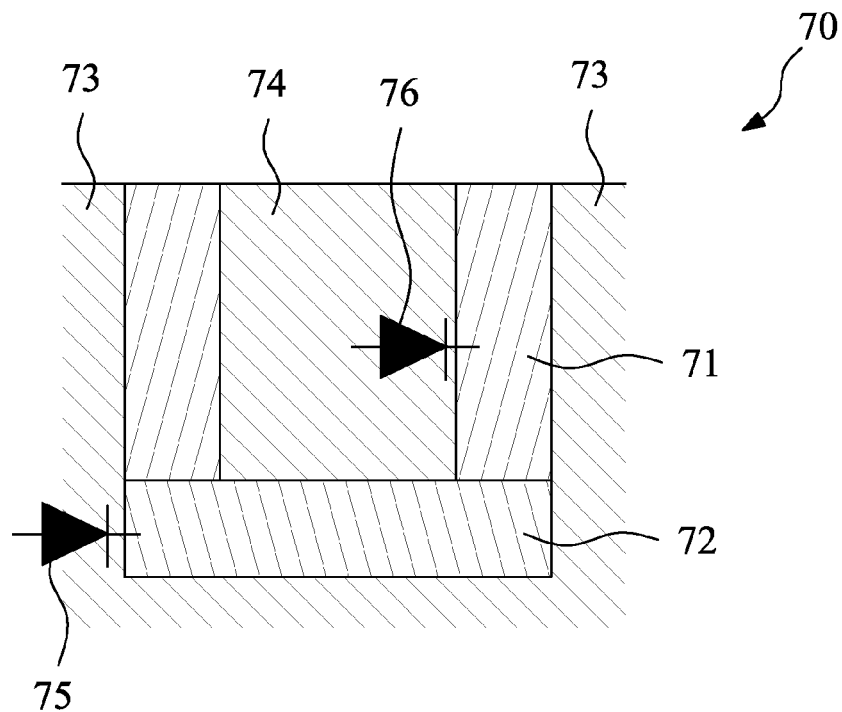
FIG. 7B is a schematic cross-sectional diagram of the layout view in accordance with some embodiments.

FIG. 7A is a schematic layout view of a selected area 70 in accordance with some embodiments. FIG. 7B is a schematic cross-sectional diagram of the layout in accordance with some embodiments. Referring to FIGS. 7A and 7B, the layout shows a high voltage N well (HVNW) 71 and an N+ (heavily doped with an n-type impurity) buried layer (NBL) 72. In an embodiment, the high voltage N well 71 is an enclosed square. The N+ buried layer 72 is inside the high voltage N well 71 in FIG. 7A. The N+ buried layer 72 connects the high voltage N well 71 at the bottom of the high voltage N well 71 as shown in FIG. 7B. The high voltage N well 71 and the N+ buried layer 72 are surrounded by a P substrate 73. Another P substrate 74 is disposed inside the high voltage N well 71 and on the N+ buried layer 72.

Two equivalent diodes 75, 76 can be obtained from the layout. That is, the high voltage N well 71, the N+ buried layer 72 and the P substrate 73 define an equivalent diode 75. The high voltage N well 71, the N+ buried layer 72 and the P substrate 74 define an equivalent diode 76. Therefore, two equivalent diodes 75, 76 can be extracted from the layout in FIG. 7A.

Figure 8A:
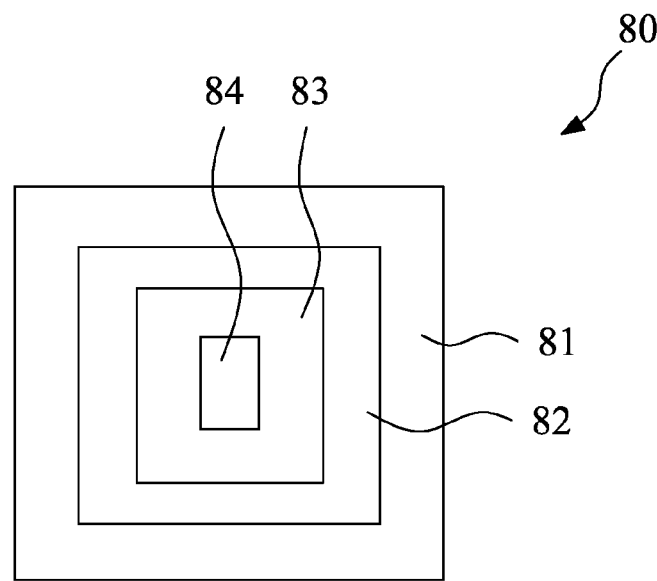
FIG. 8A is a schematic layout view of a selected area in accordance with some embodiments.
Figure 8B:
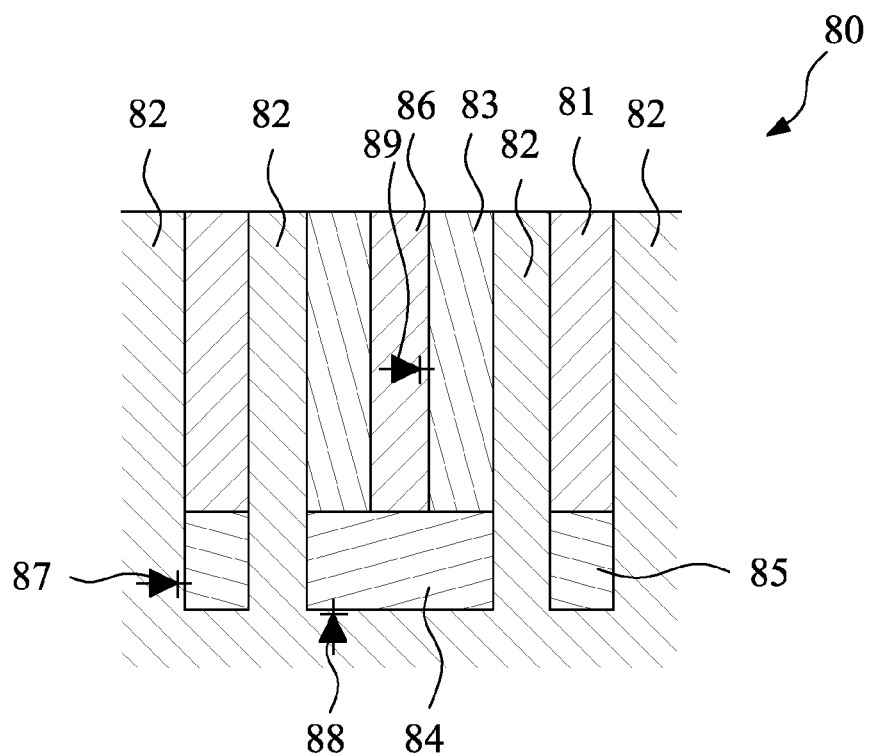
FIG. 8B is a schematic cross-sectional diagram of the layout view in FIG. 8A in accordance with some embodiments.

FIG. 8A is a schematic layout view of a selected area 80 in accordance with some embodiments. FIG. 8B is a schematic cross-sectional diagram of the layout in accordance with some embodiments. Referring to FIGS. 8A and 8B, the layout shows a first high voltage N well 81, a P substrate 82, a second high voltage N well 83 and an N+ buried layer 84. In an embodiment, the first high voltage N well 81 and the second high voltage N well 83 are enclosed squares. The P substrate 82 is inside the first high voltage N well 81, and the second high voltage N well 83 is inside the P substrate 82. The N+ buried layer 84 is inside the second high voltage N well 83 in FIG. 8A. The N+ buried layer 84 connects the second high voltage N well 83 at the bottom of the second high voltage N well 83 as shown in FIG. 8B. Another N+ buried layer 85 connects the first high voltage N well 81 at the bottom of the first high voltage N well 81. The first high voltage N well 81, the second high voltage N well 83, the N+ buried layer 84 and the N+ buried layer 85 are surrounded by the P substrate 82. Another P substrate 86 is disposed inside the second high voltage N well 83 and on the N+ buried layer 84.

Three equivalent diodes 87, 88, 89 can be obtained from the layout. That is, the first high voltage N well 81, the N+ buried layer 85 and the P substrate 82 define an equivalent diode 87. The second high voltage N well 83, the N+ buried layer 84 and the P substrate 82 define an equivalent diode 88. The second high voltage N well 83, the N+ buried layer 84 and the P substrate 86 define an equivalent diode 89. Therefore, three equivalent diodes 87, 88, 89 can be extracted from the layout in FIG. 8A.

Figure 9A:
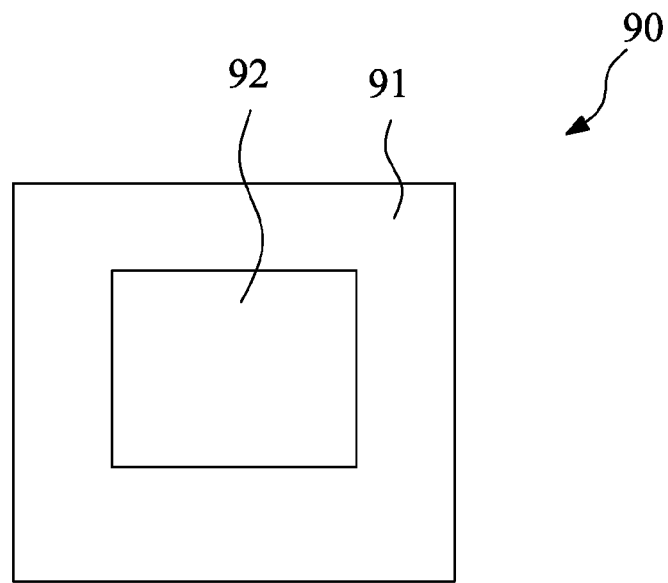
FIG. 9A is a schematic layout view of a selected area in accordance with some embodiments.
Figure 9B:
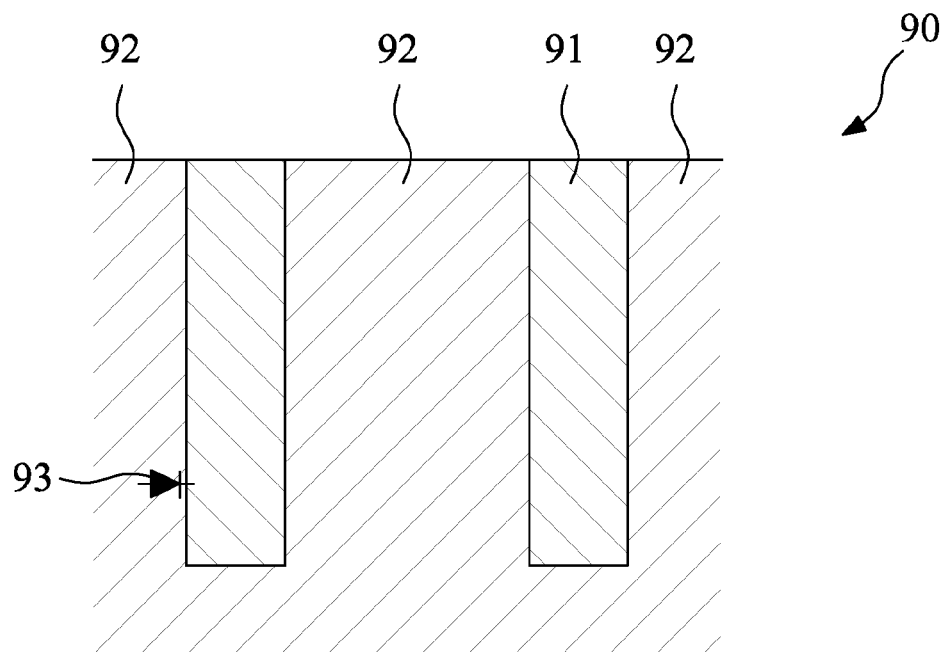
FIG. 9B is a schematic cross-sectional diagram of the layout view in FIG. 9A in accordance with some embodiments.

FIG. 9A is a schematic layout view of a selected area 90 in accordance with some embodiments. FIG. 9B is a schematic cross-sectional diagram of the layout in accordance with some embodiments. Referring to FIGS. 9A and 9B, the layout shows a high voltage N well 91 and a P substrate 92. In an embodiment, the high voltage N well 91 is an enclosed square. The P substrate 92 surrounds the high voltage N well 91, and is inside the high voltage N well 91.

One equivalent diode 93 can be obtained from the layout. That is, the high voltage N well 91 and the P substrate 92 define an equivalent diode 93. Therefore, the equivalent diode 93 can be extracted from the layout in FIG. 9A.

Figure 10A:
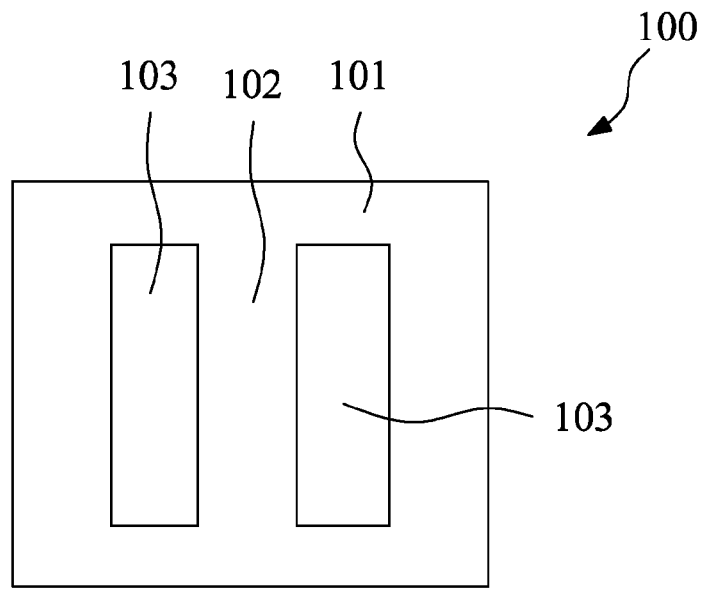
FIG. 10A is a schematic layout view of a selected area in accordance with some embodiments.
Figure 10B:
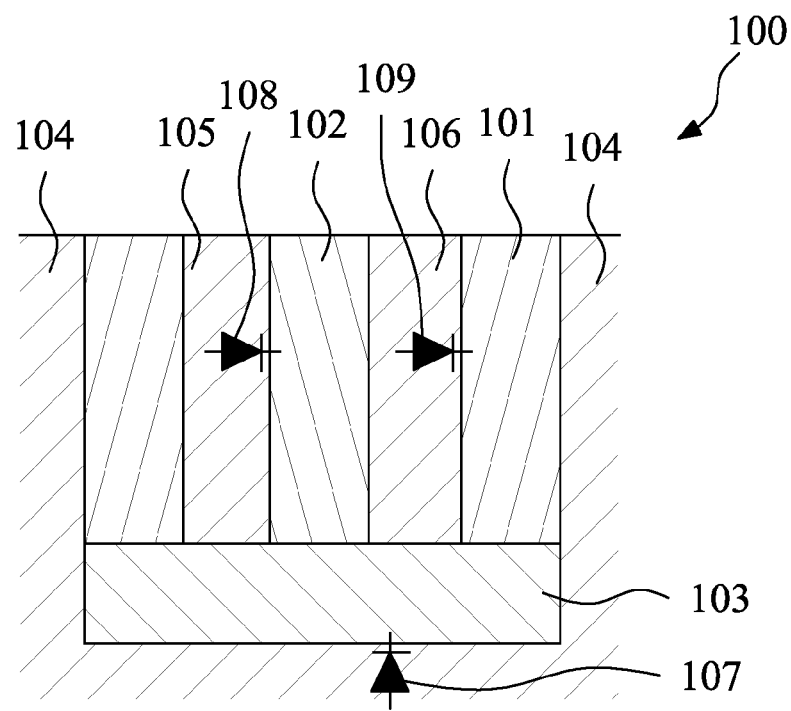
FIG. 10B is a schematic cross-sectional diagram of the layout view in FIG. 10A in accordance with some embodiments.

FIG. 10A is a schematic layout view of a selected area 100 in accordance with some embodiments. FIG. 10B is a schematic cross-sectional diagram of the layout in accordance with some embodiments. Referring to FIGS. 10A and 10B, the layout shows a high voltage N well 101, a connecting portion 102 and an N+ buried layer 103. In an embodiment, the high voltage N well 101 is an enclosed square. The connecting portion 102 connects two sides of the high voltage N well 101. The N+ buried layer 103 is inside the high voltage N well 101 in FIG. 10A. The N+ buried layer 103 connects the high voltage N well 101 and the connecting portion 102 at the bottoms of the high voltage N well 101 and the connecting portion 102 as shown in FIG. 10B. The high voltage N well 101 and the N+ buried layer 103 are surrounded by a P substrate 104. Another P substrate 105 is disposed inside the high voltage N well 101 and the connecting portion 102 on the N+ buried layer 103 and on the left of the connecting portion 102. Another P substrate 106 is disposed inside the high voltage N well 101 and the connecting portion 102 on the N+ buried layer 103 and on the right of the connecting portion 102.

Three equivalent diodes 107, 108, 109 can be obtained from the layout. That is, the high voltage N well 101, the N+ buried layer 103 and the P substrate 104 define an equivalent diode 107. The high voltage N well 101, the connecting portion 102, the N+ buried layer 103 and the P substrate 105 define an equivalent diode 108. The high voltage N well 101, the connecting portion 102, the N+ buried layer 103 and the P substrate 106 define an equivalent diode 109. Therefore, three equivalent diodes 107, 108, 109 can be extracted from the layout in FIG. 10A.

Figure 11A:
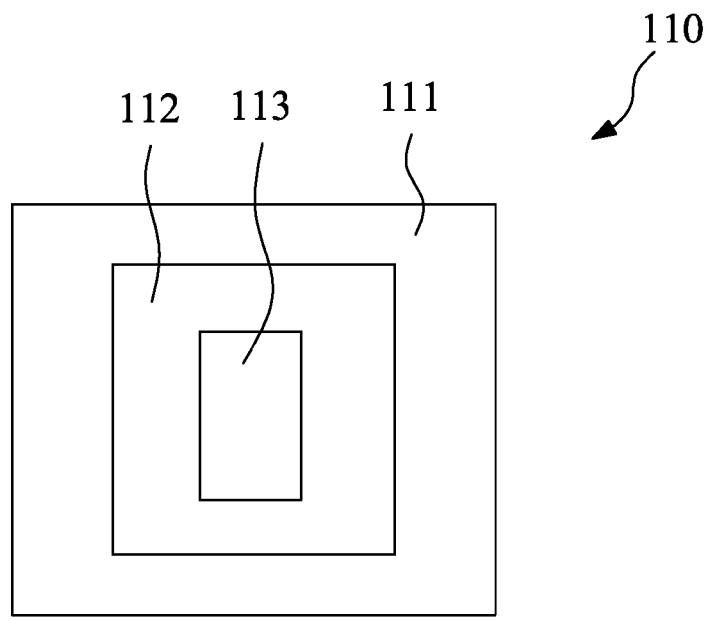
FIG. 11A is a schematic layout view of a selected area in accordance with some embodiments.
Figure 11B:
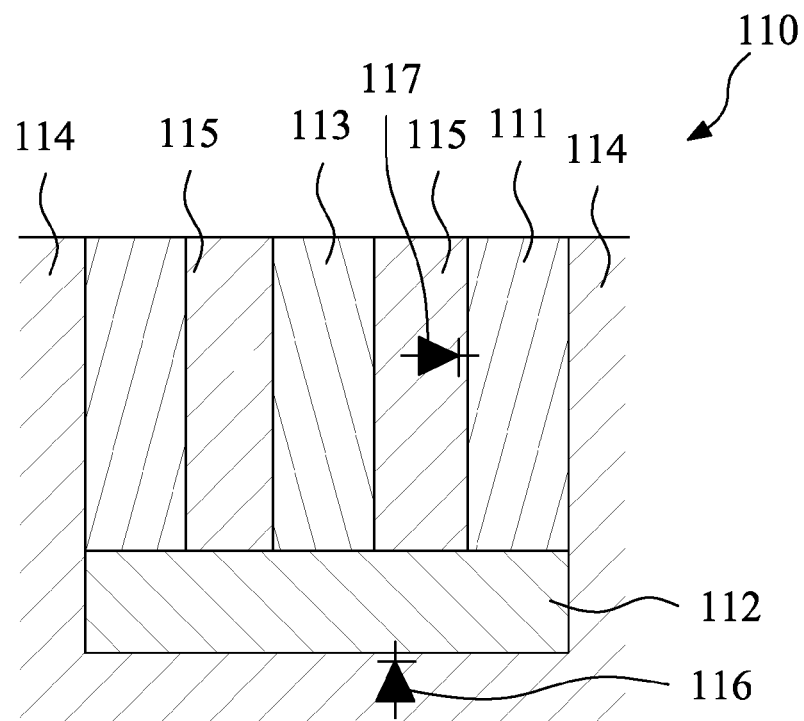
FIG. 11B is a schematic cross-sectional diagram of the layout view in FIG. 11A in accordance with some embodiments.

FIG. 11A is a schematic layout view of a selected area 110 in accordance with some embodiments. FIG. 11B is a schematic cross-sectional diagram of the layout in accordance with some embodiments. Referring to FIGS. 11A and 11B, the layout shows a high voltage N well 111, an N+ buried layer 112 and a central portion 113. In an embodiment, the high voltage N well 111 is an enclosed square. The N+ buried layer 112 is inside the high voltage N well 111 in FIG. 11A, and the central portion 113 is inside the N+ buried layer 112. The N+ buried layer 112 connects the high voltage N well 111 and the central portion 113 at the bottoms of the high voltage N well 111 and the central portion 113 as shown in FIG. 11B. The high voltage N well 111 and the N+ buried layer 112 are surrounded by a P substrate 114. Another P substrate 115 is disposed inside the high voltage N well 111 and on the N+ buried layer 112.

Two equivalent diodes 116, 117 can be obtained from the layout. That is, the high voltage N well 111, the N+ buried layer 112, the central portion 113 and the P substrate 114 define an equivalent diode 116. The high voltage N well 111, the N+ buried layer 112, the central portion 113 and the P substrate 115 define an equivalent diode 117. Therefore, two equivalent diodes 116, 117 can be extracted from the layout in FIG. 11A.

In the above-mentioned layouts, at least one diode can be extracted by a method in accordance with the present disclosure instead of directly searching for HV parasitic transistors. Then, at least one diode pair is selected and filtered to determine a parasitic transistor. That is, the parasitic transistor which may cause a potential ESD risk can be obtained from a pool of diode pairs in accordance with the signal and distance constraints. The method of the disclosure can provide a relatively efficient and flexible interface for various types of ESD risk.

In some embodiments, in a method of detecting a parasitic transistor, several diodes are extracted from a selected area. At least one diode pair is selected from the diodes in accordance with signals connected to the diodes. The at least one diode pair is filtered in accordance with a threshold distance to determine whether at least one parasitic transistor is obtained.

In some embodiments, a non-transitory computer-readable storage medium storing program instructions that when executed by a computer cause the computer to perform a method is provided. In the method, several diodes are extracted from a selected area. At least one diode pair is selected from the diodes in accordance with signals connected to the diodes. The at least one diode pair is filtered in accordance with a threshold distance to determine whether at least one parasitic transistor is obtained.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration. Embodiments of the disclosure are applicable in variations and/or combinations of transistor types.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method of detecting a parasitic transistor, the method comprising:
   using a computer to convert a layout of a selected area to an equivalent circuit having a plurality of diodes;
   tracing signals coupled to the diodes to determine at least one diode pair from the diodes; and
   filtering the at least one diode pair in accordance with a threshold distance to determine whether at least one parasitic transistor is obtained;
   wherein each diode pair comprises two diodes coupled, and has a common terminal and two I/O terminals, wherein the two I/O terminals are coupled to different I/O signals, and the at least one diode pair is filtered by comparing a minimum distance between the two I/O terminals of the diode pair and the threshold distance, and if the minimum distance is smaller than the threshold distance, the parasitic transistor comprising the diode pair is obtained.

2. The method according to claim 1, wherein the threshold distance is determined by a specific high voltage indicated on a dummy layer.

3. The method according to claim 1, wherein two diodes are extracted from the layout showing an enclosed high voltage N well surrounded by a P substrate and an N+ buried layer inside the enclosed high voltage N well.

4. The method according to claim 1, wherein one diode is extracted from the layout showing an enclosed high voltage N well surrounded by a P substrate and the P substrate inside the enclosed high voltage N well.

5. The method according to claim 1, wherein three diodes are extracted from the layout showing an enclosed high voltage N well having a connecting portion for coupling two sides of the enclosed high voltage N well and an N+ buried layer inside the enclosed high voltage N well, and the enclosed high voltage N well is surrounded by a P substrate.

6. The method according to claim 1, wherein two diodes are extracted from the layout showing an enclosed high voltage N well surrounded by a P substrate, and a central portion and an N+ buried layer inside the enclosed high voltage N well.

7. A non-transitory computer-readable storage medium storing program instructions that when executed by a computer cause the computer to perform a method, the method comprising:
- extracting a plurality of diodes from a layout of a selected area;
- selecting at least one diode pair from the diodes in accordance with signals coupled to the diodes; and
- filtering the at least one diode pair in accordance with a threshold distance to determine whether at least one parasitic transistor is obtained;
- wherein each diode pair comprises two diodes coupled, and has a common terminal and two I/O terminals, wherein the two I/O terminals are coupled to different I/O signals, and the at least one diode pair is filtered by comparing a minimum distance between the two I/O terminals of the diode pair and the threshold distance, and if the minimum distance is smaller than the threshold distance, the parasitic transistor comprising the diode pair is obtained.

8. The computer-readable storage medium according to claim 7, wherein the threshold distance is determined by a specific high voltage indicated on a layer.

9. The computer-readable storage medium according to claim 7, wherein two diodes are extracted from the layout showing an enclosed high voltage N well surrounded by a P substrate and an N+ buried layer inside the enclosed high voltage N well.

10. The computer-readable storage medium according to claim 7, wherein one diode is extracted from the layout showing an enclosed high voltage N well surrounded by a P substrate and the P substrate inside the enclosed high voltage N well.

11. The computer-readable storage medium according to claim 7, wherein three diodes are extracted from the layout showing an enclosed high voltage N well having a connecting portion for coupling two sides of the enclosed high voltage N well and an N+ buried layer inside the enclosed high voltage N well, and the enclosed high voltage N well is surrounded by a P substrate.

12. The computer-readable storage medium according to claim 7, wherein two diodes are extracted from the layout showing an enclosed high voltage N well surrounded by a P substrate, and a central portion and an N+ buried layer inside the enclosed high voltage N well.

13. A method of detecting a parasitic transistor, the method comprising:
- using a computer to generate an equivalent circuit having at least one diode pair from a layout of a selected area (20), wherein each diode pair comprises two diodes coupled, and has a common terminal and two I/O terminals, wherein the two I/O terminals are coupled to different I/O signals;
- determining whether at least one parasitic transistor comprising the at least one diode pair is obtained in accordance with a threshold distance; and
- comparing a minimum distance between the two I/O terminals of the diode pair and the threshold distance, and if the minimum distance is smaller than the threshold distance, the parasitic transistor is obtained.

14. The method according to claim 13, further comprising:
- tracing the two I/O terminals of each diode pair to determine whether they are coupled to external signals or internal signals.

15. The method according to claim 13, wherein the threshold distance is determined by a specific high voltage indicated on a dummy layer.

* * * * *